United States Patent
Kim et al.

(10) Patent No.: US 6,939,765 B2
(45) Date of Patent: Sep. 6, 2005

(54) INTEGRATION METHOD OF A SEMICONDUCTOR DEVICE HAVING A RECESSED GATE ELECTRODE

(75) Inventors: Ji-Young Kim, Gyeonggi-do (KR); Hyoung-Sub Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 10/649,262

(22) Filed: Aug. 26, 2003

(65) Prior Publication Data
US 2005/0014338 A1 Jan. 20, 2005

(30) Foreign Application Priority Data
Jul. 14, 2003 (KR) .................... 10-2003-0048079

(51) Int. Cl.[7] .................... H01L 21/336; H01L 21/8242
(52) U.S. Cl. .................... 438/259; 438/270; 438/243
(58) Field of Search .................... 438/259, 270, 438/271, 243, 244, 245, 303, 498

(56) References Cited

U.S. PATENT DOCUMENTS

| | | | |
|---|---|---|---|
| 5,777,370 A | * | 7/1998 | Omid-Zohoor et al. ..... 257/374 |
| 6,063,669 A | | 5/2000 | Takaishi |
| 6,214,670 B1 | * | 4/2001 | Shih et al. .................... 438/259 |
| 6,475,884 B2 | * | 11/2002 | Hshieh et al. .............. 438/498 |
| 6,818,947 B2 | * | 11/2004 | Grebs et al. ................. 438/259 |
| 6,884,677 B2 | * | 4/2005 | Kim .......................... 438/243 |
| 2003/0003651 A1 | | 1/2003 | Divakaruni et al. |
| 2003/0011032 A1 | | 1/2003 | Umebayashi |

* cited by examiner

*Primary Examiner*—Michael Lebentritt
*Assistant Examiner*—Walter L. Lindsay, Jr.
(74) *Attorney, Agent, or Firm*—Marger Johnson & McCollom, P.C.

(57) ABSTRACT

Embodiments of the invention are directed to an integrated circuit device and a method for forming the device. In some embodiments of the invention, two types of transistors are formed on a single substrate, transistors: transistors having a recessed gate, and transistors having a planer gate electrode. In other embodiments, transistors having a recessed gate are formed in multiple areas of the same substrate. Additionally, gates of the transistors in more than one region may be formed simultaneously.

20 Claims, 15 Drawing Sheets

INTEGRATION METHOD OF A SEMICONDUCTOR DEVICE HAVING A RECESSED GATE ELECTRODE

CROSS REFERENCE TO RELATED APPLICATIONS

This applications claims priority from Korean Patent Applications No. 2003-48079, filed on Jul. 14, 2003, the contents of which are incorporated herein by reference in their entirety.

1. Tecnnical Field

This disclosure relates to an integration manufacturing method of a semiconductor memory device such as a Dynamic Random Access Memory (DRAM), and, more specifically, to a method to produce DRAM cells having a recessed gate and a planer gate electrode.

2. Background

Integrated circuits, such as ultra-large scale integrated (ULSI) circuits, can include as many as one billion transistors or more. Most typically, ULSI circuits are formed of Field Effect Transistors (FETs) formed in a Complementary Metal Oxide Semiconductor (CMOS) process. Each MOSFET includes a gate electrode formed over a channel region of the semiconductor substrate, which runs between a drain region and source region. To increase the device density and operation speed of the integrated circuits, the feature size of transistor within the circuits must be reduced. However, with the continued reduction in device size, sub-micron scale MOS transistors have to overcome many technical challenges. As the MOS transistors become narrower, that is, their channel length decreases, problems such as junction leakage, source/drain breakdown voltage, and data retention time become more pronounced.

One solution to decrease the physical dimension of ULSI circuits is to form recessed gate or "trench-type" transistors, which have a gate electrode buried in a groove formed in a semiconductor substrate. This type of transistor reduces short channel effects by effectively lengthening the effective channel length by having the gate extend into the semiconductor substrate. An example of a portion of a combined ULSI circuit including a standard transistor and a recessed gate transistor is illustrated in FIG. 1. However, effectively forming recessed gate transistors in ULSI circuits that also contain non recessed gate transistors has been a difficult task.

Embodiments of the invention address these and other problems in the prior art.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are to facilitate explanation and understanding.

DETAILED DESCRIPTION OF EMBODIMENTS OF THE INVENTION

In the following detailed descriptions, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the invention can provide, compared to conventional memory circuits, an increase in effective channel length, a decrease in channel dosing, and improved qualities in junction leakage and data retention time in a memory circuit that includes at least two types of transistors on a single substrate: transistors having a recessed gate, and transistors having a planer gate electrode.

Figure 1:
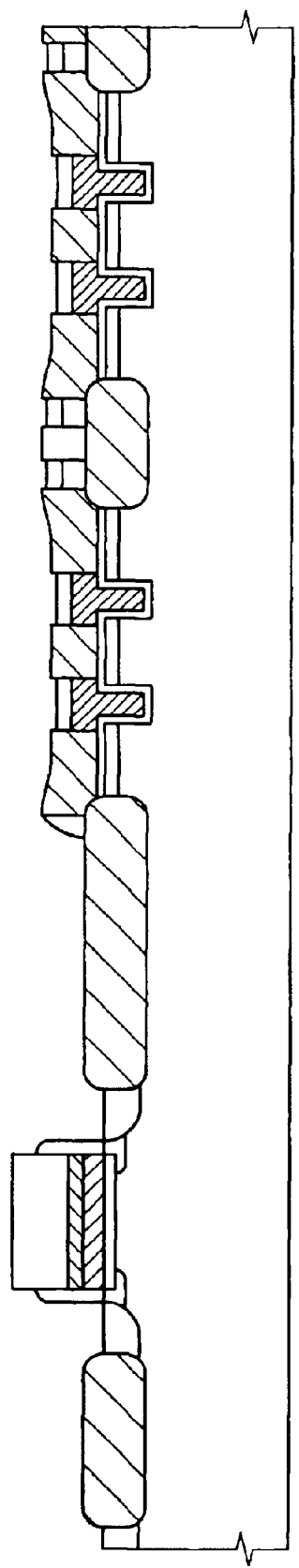
FIG. 1 is a cross-sectional diagram of a MOSFET having a recessed gate according to the prior art.
Figure 2:
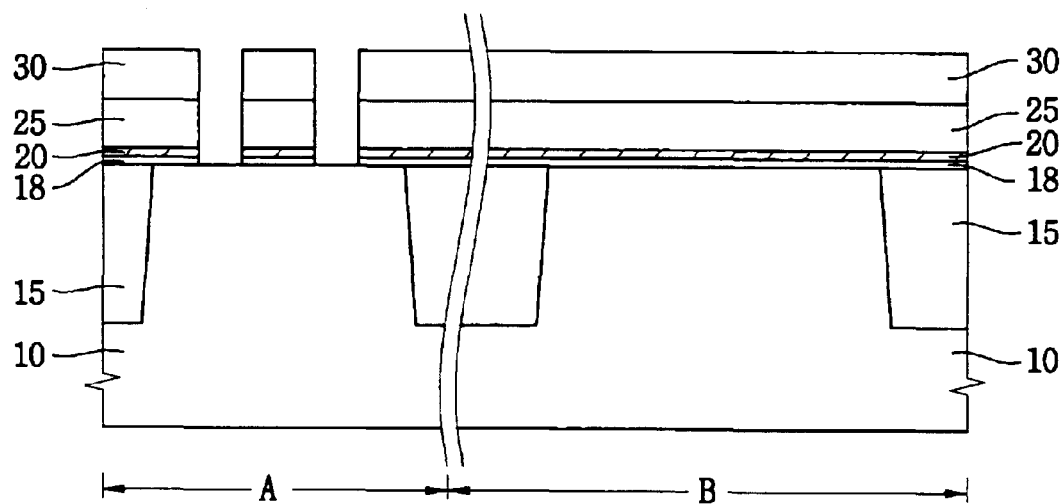
FIGS. 2, 3, 4, 5A, 6A and 7A are cross-sectional diagrams of a method of forming a MOSFET with a recessed gate and a planer gate electrode according to an embodiment of the present invention.

A manufacturing method of a semiconductor device of an embodiment of the present invention is described with reference to FIGS. 2 to 7. As shown in FIG. 2, a semiconductor device according to embodiments of the present invention includes a memory cell array section A and a peripheral circuit section B. The memory cell array section is illustrated in the left-had portion of the figures, while the peripheral circuit section is illustrated in the right-hand portion.

An isolation region 15 is formed on a silicon substrate 10. A thin pad oxide film 18 is formed on the isolation 15 and over an active region in the memory cell array section. An etch stopper layer 20 is formed on the pad oxide film 18. The etch stopper layer 20 is preferably made of nitride, for example SiN, with a thickness of about 100 to 200 angstroms. A first oxide layer 25 is formed on the etch stopper layer 20. The first oxide layer 25 can be formed to a thickness of approximately 1000 angstroms in some embodiments.

Figure 3:
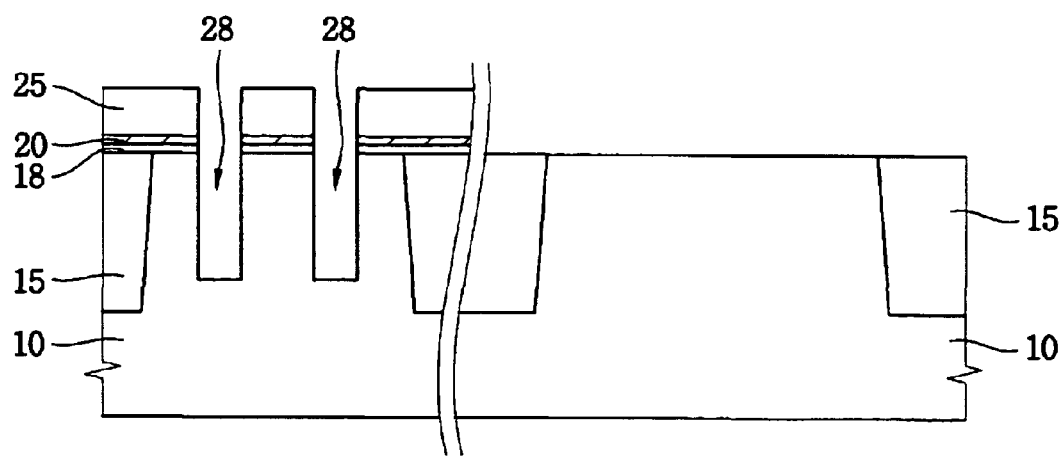

A recess mask, for forming the recessed gates for the memory cells is formed in a photoresist layer 30 by conventional photolithography and etching processes. As shown in FIG. 3, a recess gate hole 28 is formed in the memory cell side of the substrate 10 by etching the first oxide layer 25, the pad oxide 18, and the etch stopper layer 20. On the peripheral side of the substrate 10, the first oxide layer 25, the pad oxide 18, and the etch stopper layer are all removed.

Figure 4:
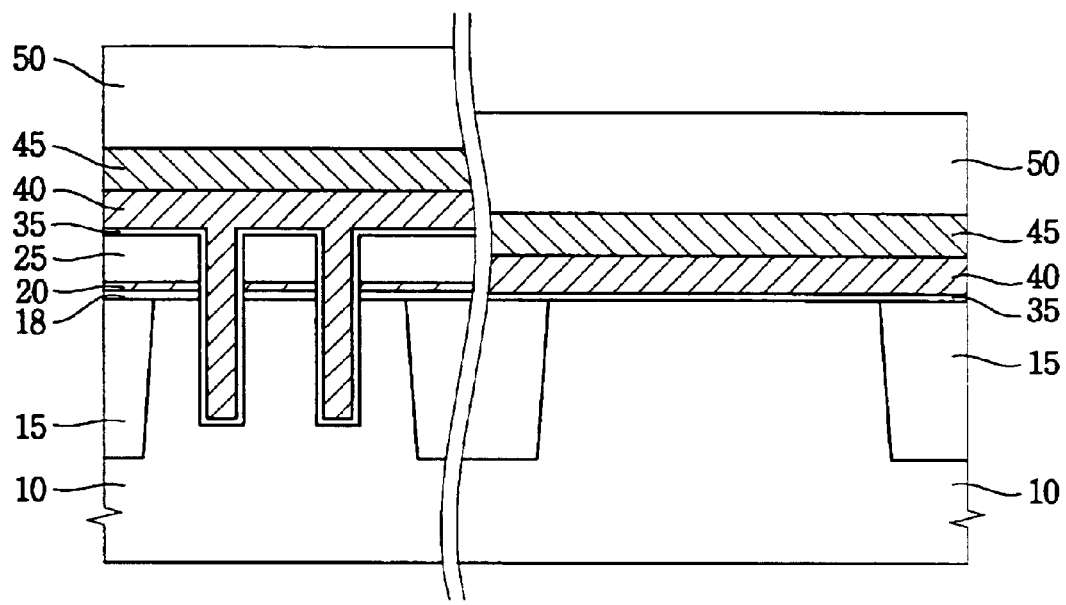
Figure 5A:
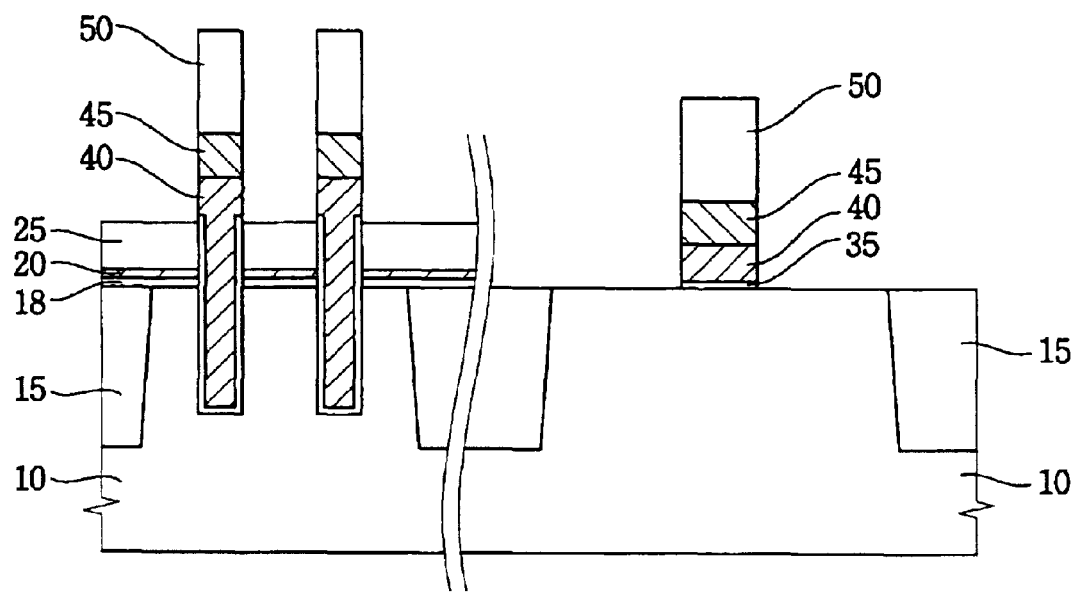

As shown in FIG. 4, a gate oxide 35 is formed on the silicon substrate 10 and within the recess holes 28. A gate electrode layer is formed on the gate oxide 35. The gate electrode layer is formed as a two layer structure including a lower gate electrode poly layer 40 and an upper gate electrode layer 45, which could be, for example, Wsi. Next, a gate mask layer 50 is formed on the upper gate electrode layer 45. As shown in FIG. 5A, the gate electrode is completed by performing conventional photolithography and etching processes on the gate mask layer 50, the upper gate electrode 45, and the gate oxide layer 35.

Figure 6A:
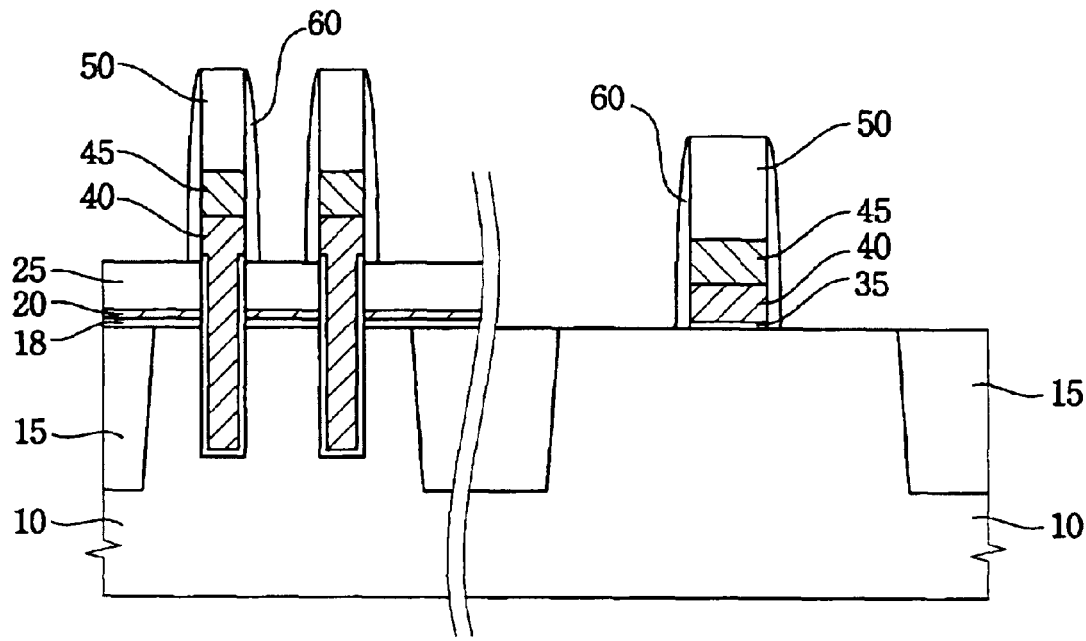
Figure 7A:
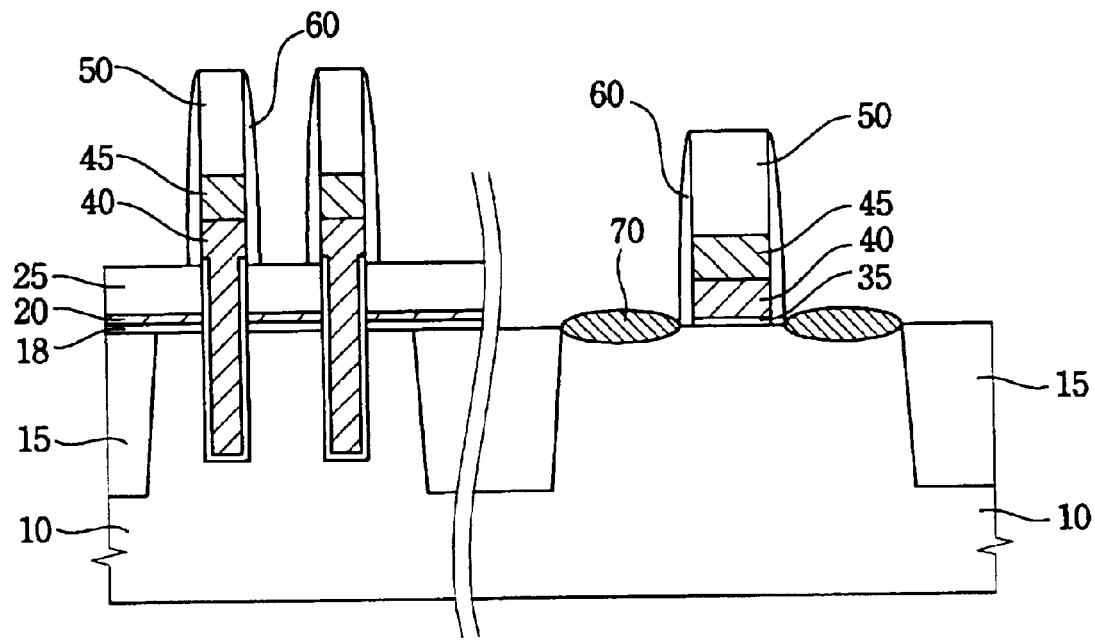

Next, as illustrated in FIG. 6A, a deposited insulating layer is etched back to form a spacer 60. Finally, as illustrated in FIG. 7A, a Cosi (Cobalt-Silicon) layer 70 is formed on the peripheral circuit region. The Cosi layer 70 reduces sheet resistance in the peripheral region.

Figure 5B:
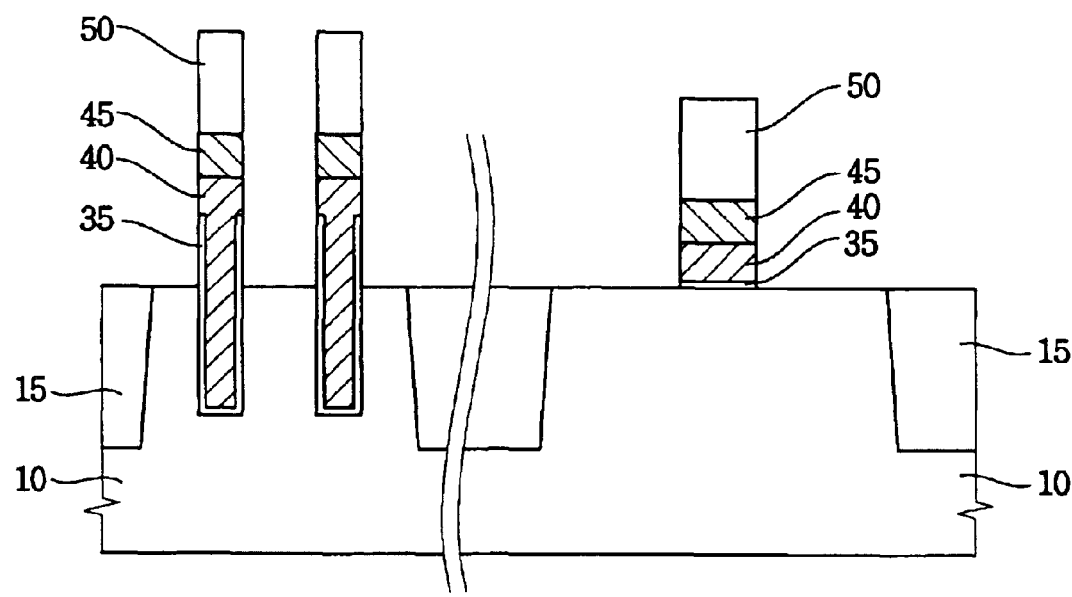
FIGS. 5B and 6B are cross-sectional diagrams illustrating alternative processes that were illustrated in FIGS. 5A and 6A, respectively.
Figure 6B:
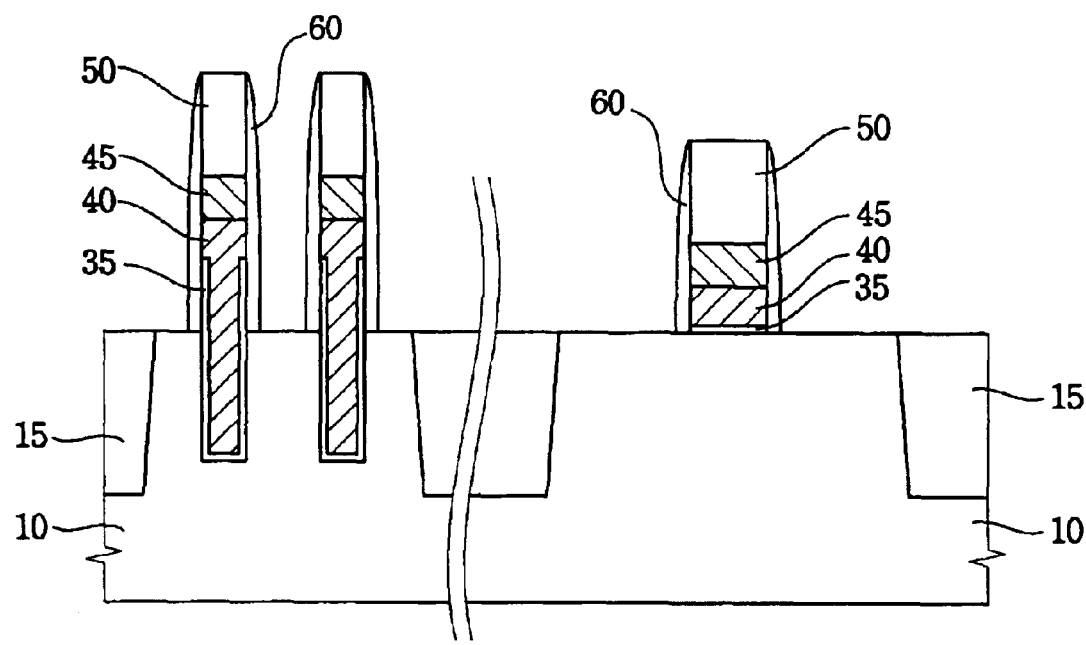
Figure 7B:
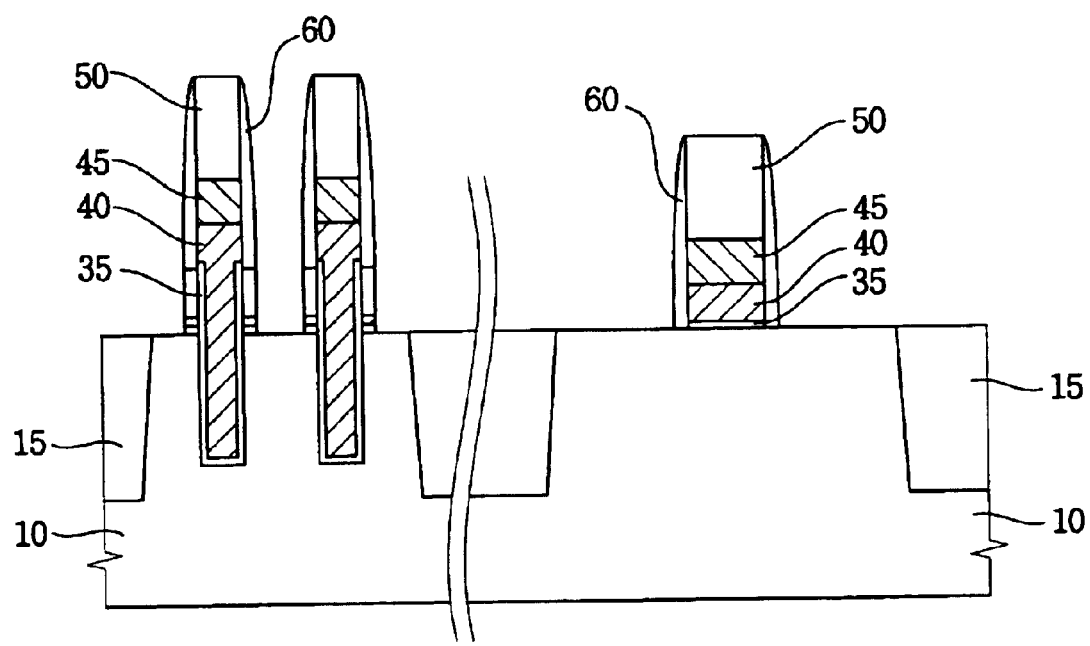
FIG. 7B is a cross-sectional diagram illustrating another alternative process that was illustrated in FIGS. 7A.

Some alternative methods for forming the memory circuit according to embodiments of the invention are illustrated in FIGS. 5B, 6B, and 7B. As shown in FIGS. 5B and 6B, the first oxide layer 25 and gate oxide 35 are removed from areas other than under the gate stack in the cell region (FIG. 5B), and gate stack spacers 60 are formed around the gate stack (FIG. 6B). FIG. 6B is similar to FIG. 6A, except for the removed oxide layer 25, etch stopper layer 20 and pad oxide layer 18. FIG. 7B shows that another alternative embodiment is to add the spacers 60 before etching the oxide layer 25, etch stopper layer 20 and pad oxide layer 18.

Figure 8:
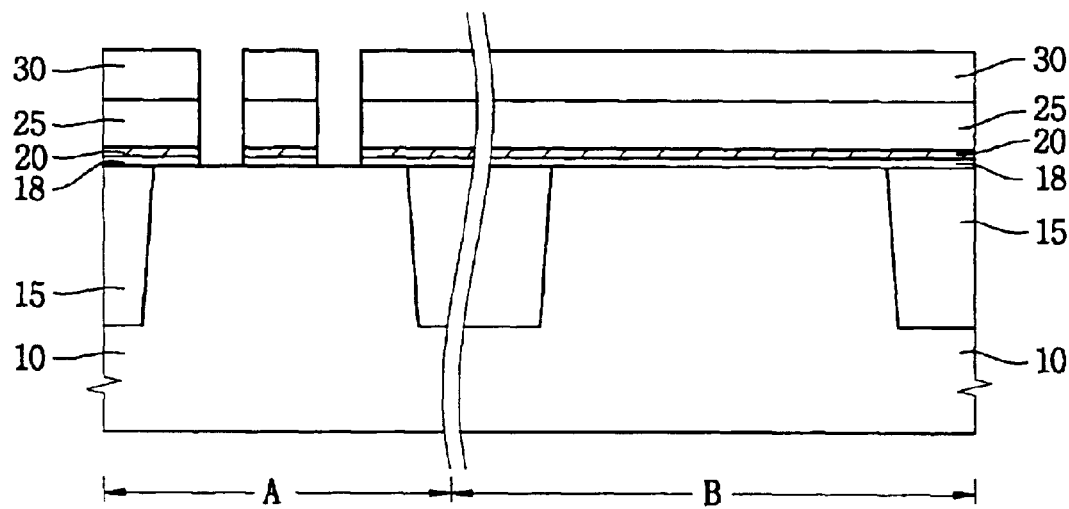
FIGS. 8 to 12 are cross-sectional diagrams illustrating a method of forming a MOSFET having a recessed gate and a planer gate electrode according to another embodiment of the present invention.

Another embodiment of forming a semiconductor memory device is illustrated in FIGS. 8–12. As shown in FIG. 8, a semiconductor device according to embodiments of the present invention includes a memory cell array section A and a peripheral circuit section B. An isolation region 15 is formed on a silicon substrate 10. A thin pad oxide film 18 is formed on the isolation 15 and over an active region in the memory cell array section. An etch stopper layer 20 is formed on the pad oxide film 18. The etch stopper layer 20 is preferably made of nitride, for example SiN, with a thickness of about 100 to 200 angstroms. A first oxide layer 25 is formed on the etch stopper layer 20.

Figure 9:
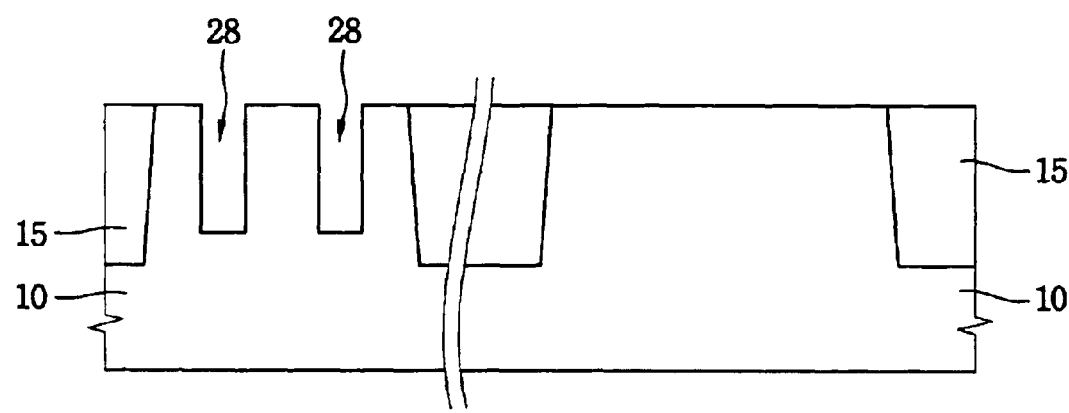
Figure 10:
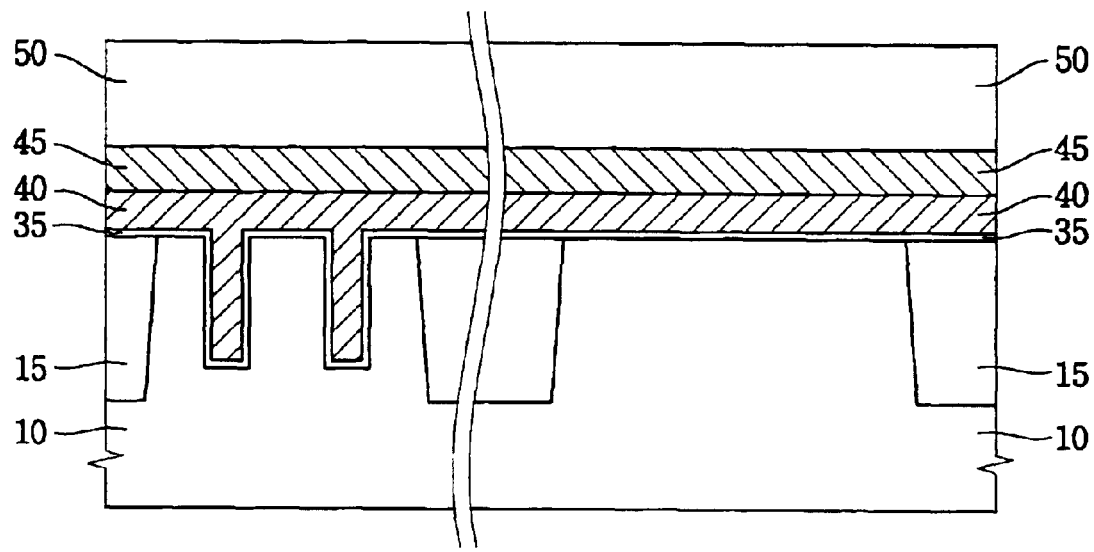

A recess mask for forming the recessed gates for the memory cells is formed in a photoresist layer 30 by conventional photolithography and etching processes. As shown in FIG. 9, a recess gate hole 28 is formed in the memory cell side of the substrate 10 by wet etching the first oxide layer 25, the etch stopper layer 20, and the pad oxide layer 18. As shown in FIG. 10, a gate oxide 35 is formed on the silicon substrate 10 and within the recess holes 28. A gate electrode having a two layer structure formed of a lower gate electrode poly 40 and an upper gate electrode Wsi 45 is formed on the gate oxide 35. A gate mask layer 50 is formed on the Wsi layer. As compared to FIG. 4, described above, FIG. 10 illustrates that the lower gate electrode layer 40, the upper gate electrode Wsi layer 45, and the gate mask layer 50 are all at even levels in both the peripheral area and the cell area of the semiconductor substrate 10.

Figure 11:
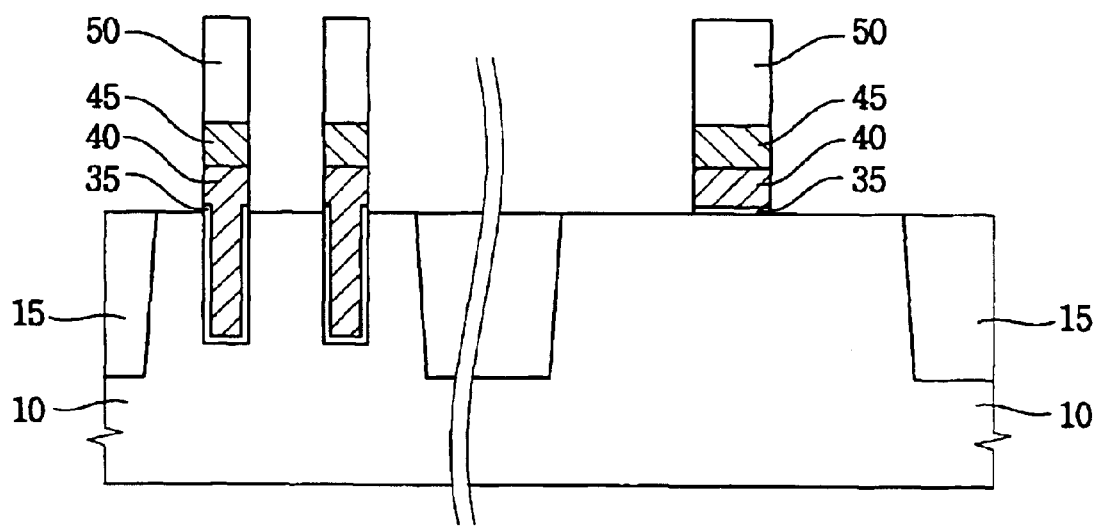
Figure 12:
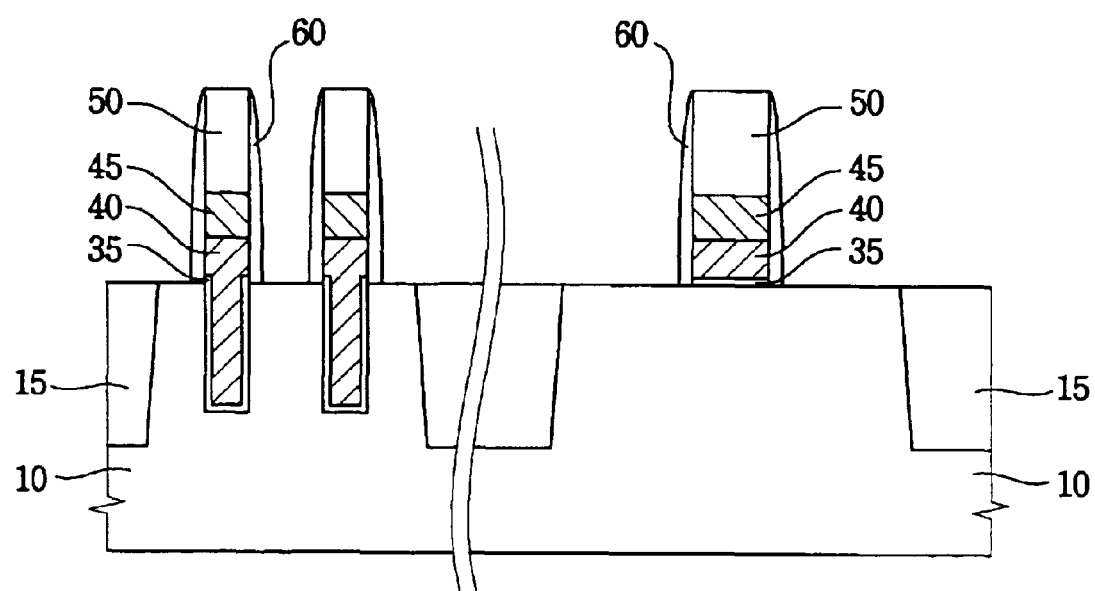

As shown in FIG. 11, a gate electrode is formed by conventional photolithography and etching processes. Next, as illustrated in FIG. 12, a spacer 60 is formed that covers the gate structures in the cell area and the peripheral area of the semiconductor substrate 10.

Figure 13:
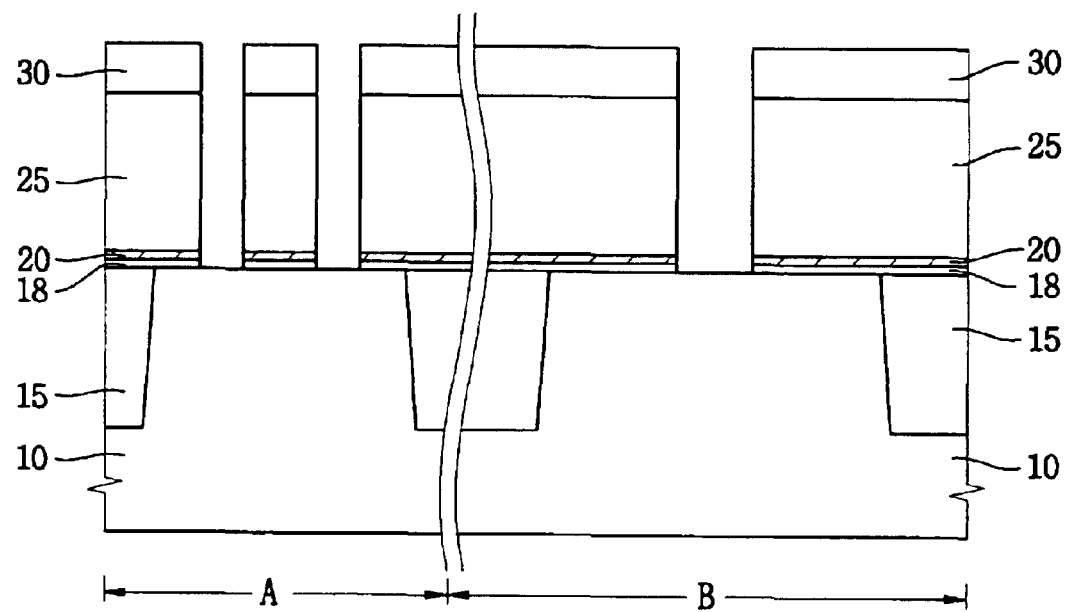
FIGS. 13 to 17 are cross-sectional diagrams illustrating a method of forming a MOSFET having a recessed gate and a planer gate electrode according to yet another embodiment of the present invention.
Figure 14:
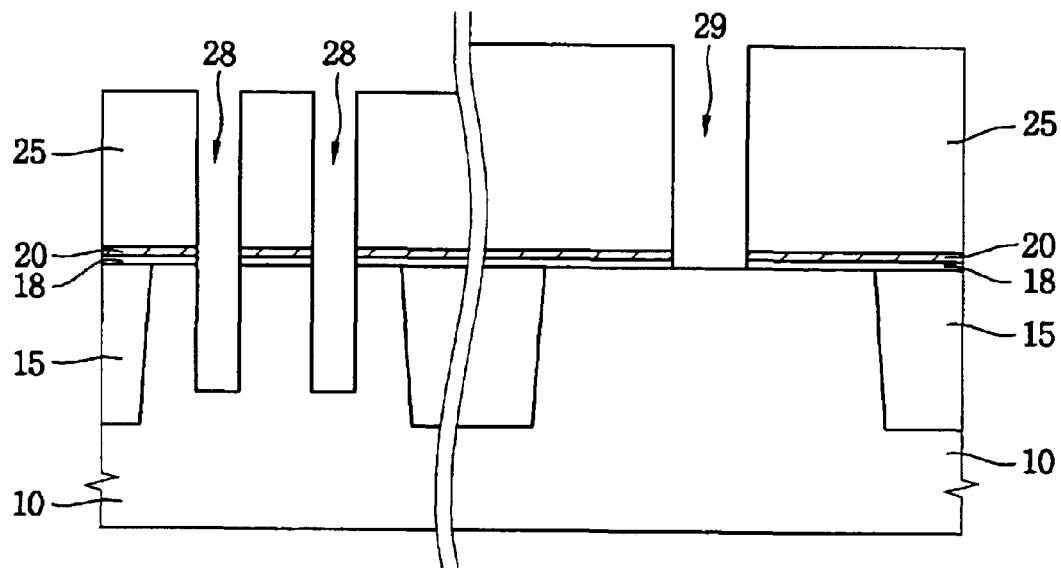

A further embodiment of forming a semiconductor memory device is illustrated in FIGS. 13–17. As shown in FIG. 13, a semiconductor device according to embodiments of the present invention includes a memory cell array section A and a peripheral circuit section B. An isolation region 15 is formed on a silicon substrate 10. A thin pad oxide film 18 is formed on the isolation 15 and over an active region in the memory cell array section. An etch stopper layer 20 is formed on the pad oxide film 18. The etch stopper layer 20 is preferably made of nitride, for example SiN, with a thickness of about 100 to 200 angstroms. A first oxide layer 25 is formed on the etch stopper layer 20. The first oxide layer 25 is formed thicker than illustrated in FIGS. 2 and 8, and is formed to a height roughly equal to the height of a gate stack in the peripheral region of the substrate 10.

A photoresist layer 30 is formed over the first oxide layer 25. Next, a recess mask for forming the recessed gates for the memory cells and for forming a planer gate hole 29 (FIG. 14) is formed in a photoresist layer 30, by conventional photolithography and etching processes. Then, the recess gate hole 28 is formed in the first oxide layer 25, etch stopper layer 20, and the pad oxide layer 18, as well as the silicon substrate 10. Additionally, the planer gate hole 29 is formed in the first oxide layer 25 on the peripheral portion of the substrate 10 by an etching process.

The first oxide layer 25 on the peripheral side of the substrate 10 is thicker than the first oxide layer 25 on the cell region portion of the substrate 10.

Figure 15:
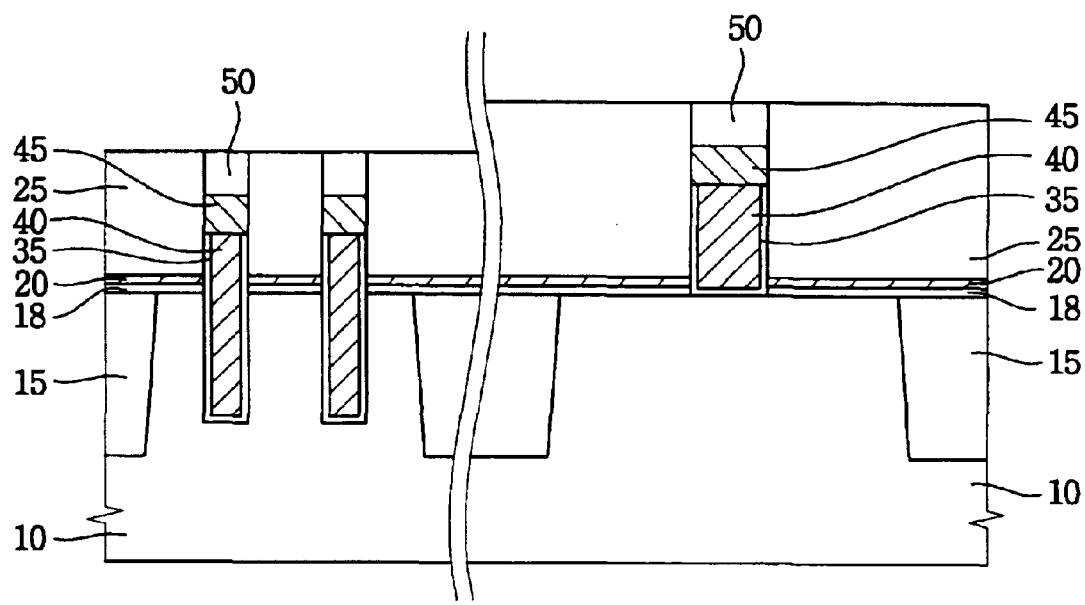

Next, as shown in FIG. 15, a gate oxide 35 is formed by oxidation process on the substrate 10 and within the recess hole 28 and planer hole 29. A gate electrode stack having a two layer structure is then formed on the gate oxide 35. The gate electrode stack is formed of a lower gate electrode poly layer 40 and an upper gate electrode Wsi layer 45.

Figure 16:
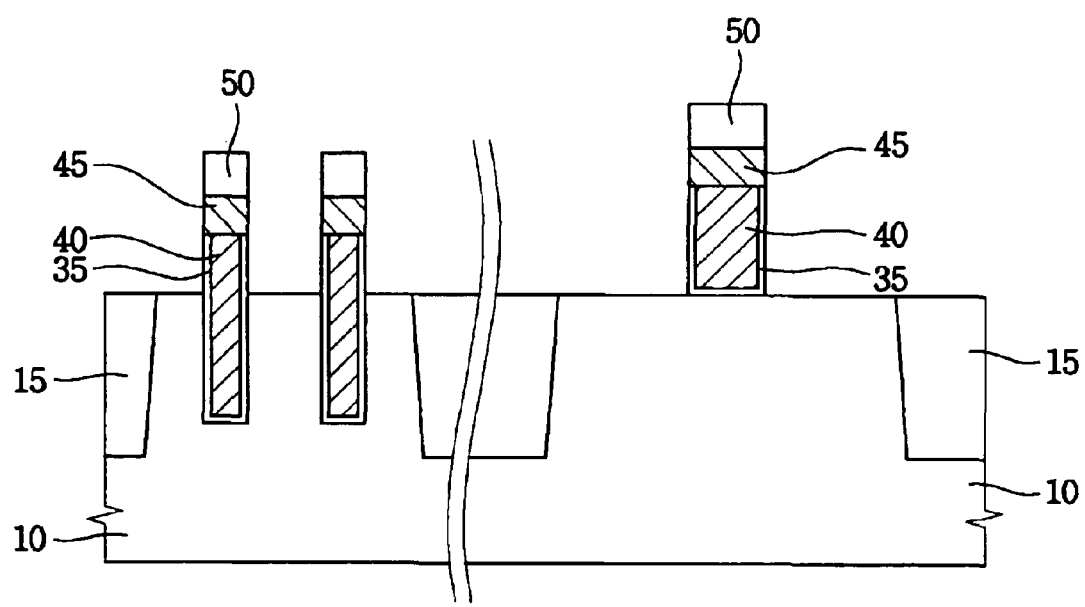
Figure 17:
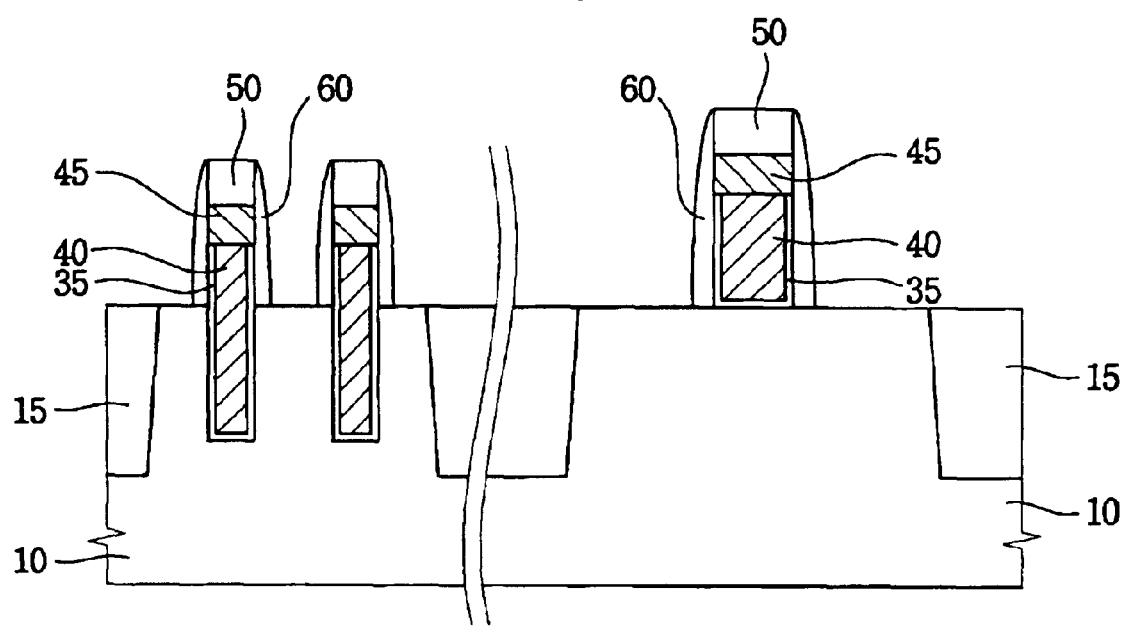

As illustrated in FIG. 16, a gate layer mask 50 is formed on the Wsi layer within the recess hole 28 and the planer hole 29. Then, the first oxide layer 25 is removed in areas not covered by the gate layer mask 50 by, for example, a wet etch process. Finally, as illustrated in FIG. 17, spacers 60 are formed on the gate stacks in the cell region and in the peripheral region of the semiconductor substrate.

Figure 18:
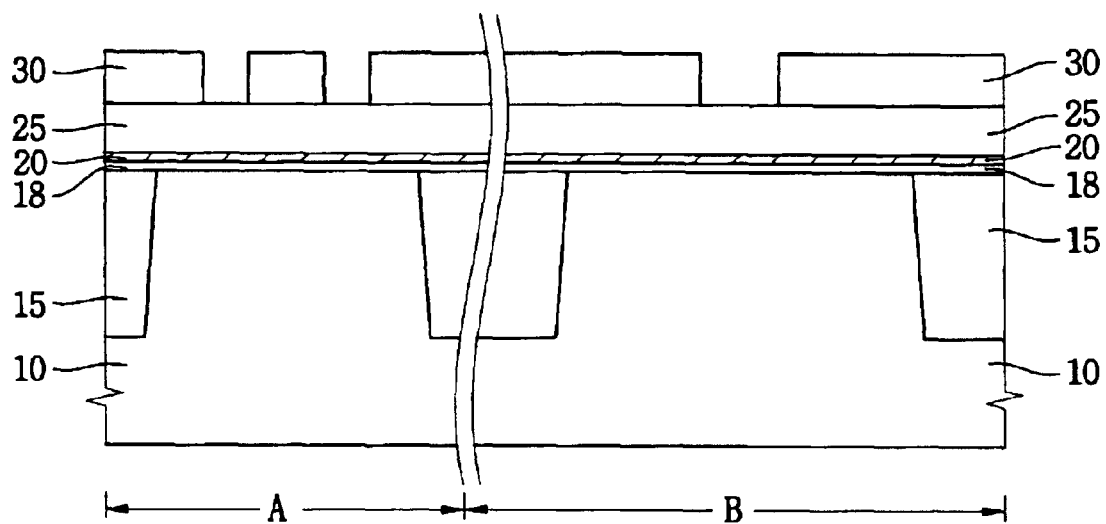
FIGS. 18 to 22 are cross-sectional diagrams illustrating of a method of forming a MOSFET having a recessed gate transistor in a cell region and a recessed gate in a peripheral region of a semiconductor substrate according to still a further embodiment of the present invention.

Yet further methods to form a semiconductor memory device are illustrated in FIGS. 18–22. As shown in FIG. 18, a semiconductor device according to embodiments of the present invention includes a memory cell array section A and a peripheral circuit section B. An isolation region 15 is formed on a silicon substrate 10. A thin pad oxide film 18 is formed on the isolation 15 and over an active region in the memory cell array section. An etch stopper layer 20 is formed on the pad oxide film 18. The etch stopper layer 20 is preferably made of nitride, for example SiN, with a thickness of about 100 to 200 angstroms.

Figure 19:
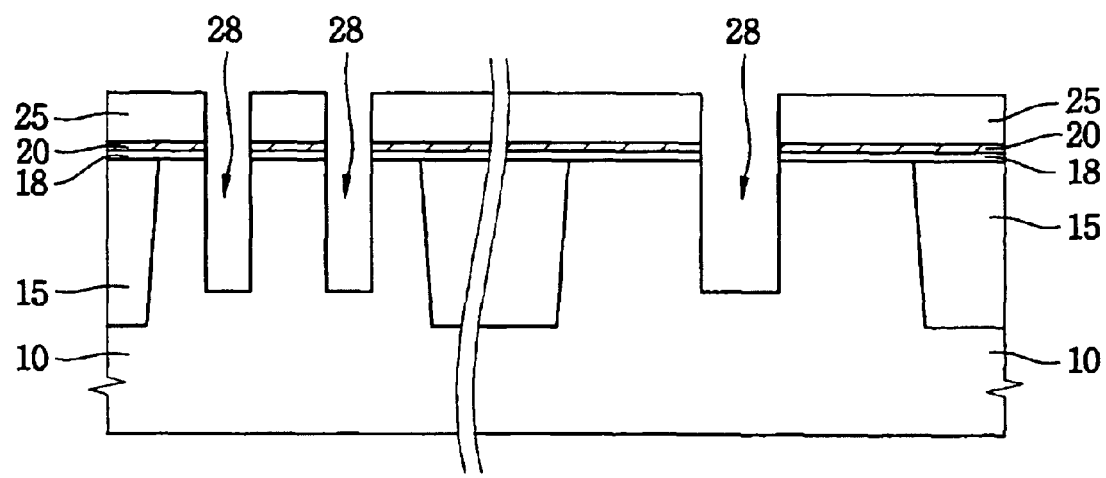

A first oxide layer 25 is formed on the etch stopper layer 20. Next, a recess mask 30 is formed by conventional photolithography and etching processes. As shown in FIG. 19, a recess gate hole 28 is formed by etch process in the memory cell region and in the peripheral region of the substrate 10. Next, as shown in FIG. 20, a gate oxide 30 is formed by, for example, an oxidation process in the recess holes 28.

Figure 20:
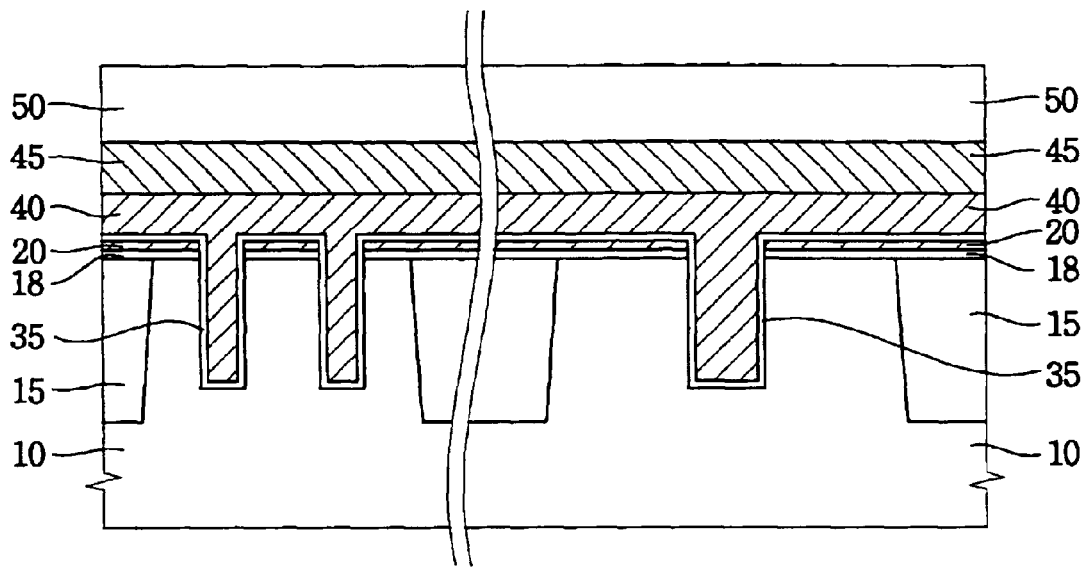

As illustrated in FIG. 20, a gate electrode layer is formed on the gate oxide 35. The gate electrode layer of FIG. 20 has a two layer structure formed of a lower gate electrode poly 40 and an upper gate electrode Wsi 45. In this embodiment, the lower gate electrode poly 40 extends into the recessed gate holes in the cell region and in the peripheral region of the substrate 10. A gate mask layer 50 is formed on the Wsi layer.

Figure 21:
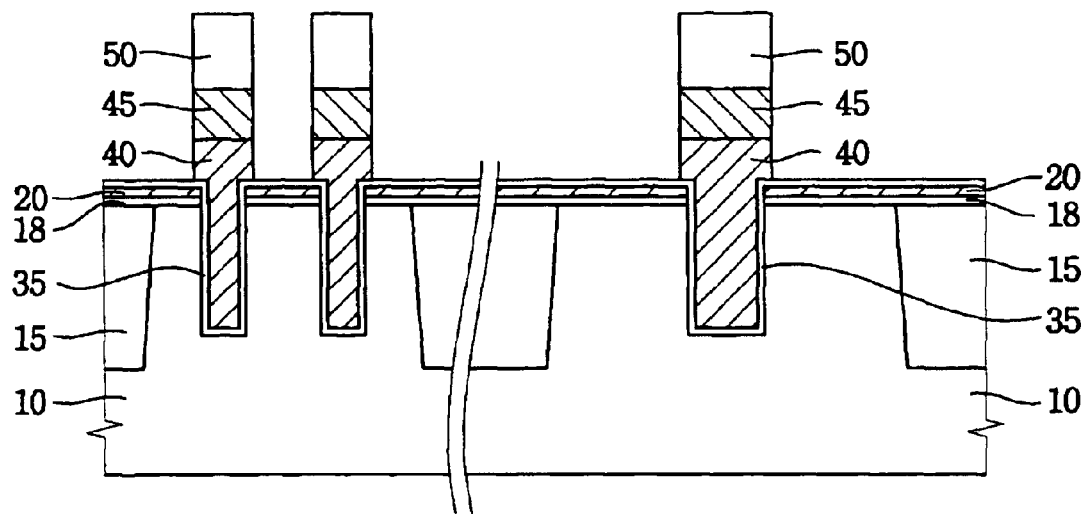
Figure 22:
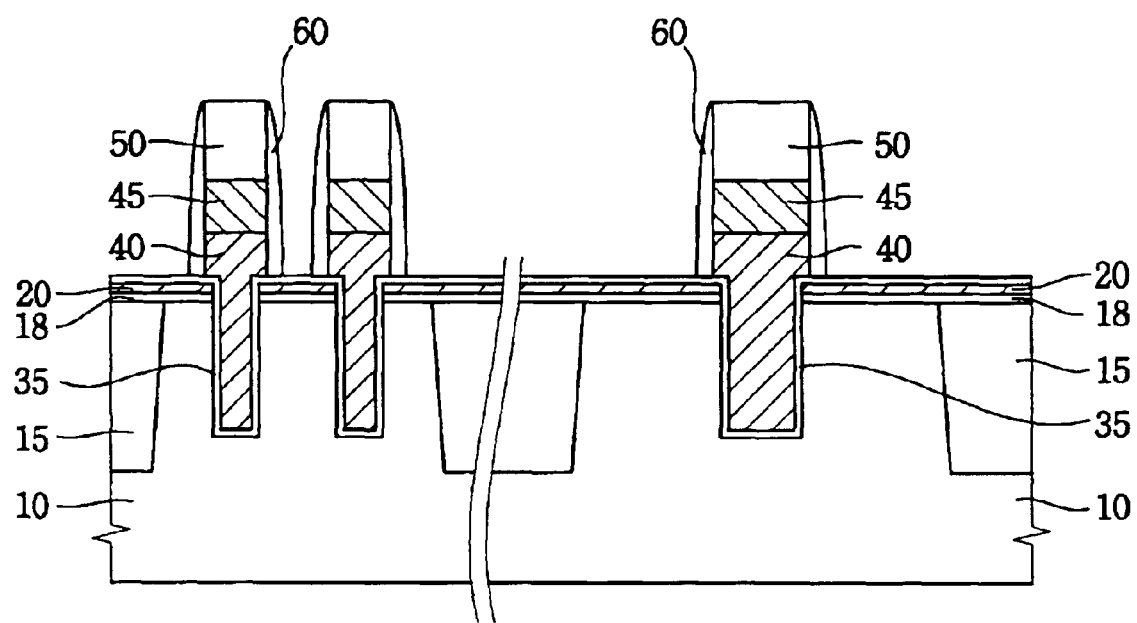

As shown in FIG. 21, a set of gates is formed by conventional photolithography and etching processes in the cell region and the peripheral region. Finally, as illustrated in FIG. 22, a spacer 60 is formed by, for example, an etch back process.

As described above in detail, in embodiments of the present invention, a recessed gate cell and a planer gate electrode are simultaneously formed in the same photolithography step. This allows memory circuits to be developed so that the manufacturing processes will be reasonable without increasing the number of the photolithography steps.

Those skilled in the art recognize that the method of forming integrated circuits described herein can be implemented in many different variations. Therefore, although various embodiments are specifically illustrated and described herein, it will be appreciated that modifications and variations of the present invention are covered by the above teachings and within the purview of the appending claims without departing from the spirit and intended scope of the invention

What is claimed is:

1. A method for forming a memory device in a semiconductor substrate having a cell region and a periphery circuit region that is separate from the cell region, the method comprising:
   forming recess gate holes in the substrate within the cell region;
   forming a gate oxide layer in the recessed gate holes and in the peripheral region;
   forming a gate layer on the gate oxide layer in both the cell region and the periphery region; and
   simultaneously patterning the gate layer and the gate oxide layer to form recessed cell gate structures in the cell region and planar cell gate structures in the peripheral region.

2. The method of claim 1, further comprising:
   simultaneously forming spacer structures on the cell gate structures in the cell region and the planar cell gate structures in the peripheral region.

3. The method of claim 1, further comprising, prior to forming the recess gate holes:
   sequentially forming a pad oxide layer, an etch stop layer, and a protective oxide layer in both the cell region and the periphery region of the substrate.

4. The method of claim 3, further comprising:
   etching the protective oxide layer, the etch stop layer, and the pad oxide layer.

5. The method of claim 4, further comprising:
   forming spacer structures on the cell gate structures in the cell region and the planar cell gate structures in the peripheral region; and
   wherein etching the layers occurs after forming the spacer structures.

6. The method of claim 1, further comprising forming a Cosi layer in the peripheral region of the substrate.

7. A method for forming a memory device in a semiconductor substrate having a cell region and a periphery circuit region that is separate from the cell region, the method comprising:
   forming recess gate holes in the substrate within the cell region and the periphery region;
   forming a gate oxide layer in the recessed gate holes;
   forming a gate layer on the gate oxide layer in both the cell region and the periphery region; and
   simultaneously patterning the gate layer and the gate oxide layer to form recessed cell gate structures in the cell region and in the periphery region.

8. The method of claim 7, further comprising:
   simultaneously forming spacer structures on the cell gate structures in the cell region and in the peripheral region.

9. The method of claim 7, further comprising, prior to forming the recess gate holes:
   sequentially forming a pad oxide layer, an etch stop layer, and a protective oxide layer in both the cell region and the periphery region of the substrate.

10. The method of claim 9, further comprising:
    etching the protective oxide layer, the etch stop layer, and the pad oxide layer.

11. The method of claim 10, further comprising:
    forming spacer structures on the cell gate structures in the cell region and in the peripheral region; and
    wherein etching the layers occurs after forming the spacer structures.

12. A method for forming a memory device in a semiconductor substrate having a cell region and a periphery circuit region that is separate from the cell region, the method comprising:
    forming a disposable layer disposed on the semiconductor substrate;
    forming a first set of gate patterns in the disposable layer over the cell region;
    forming a gate forming hole in the disposable layer over the periphery region;
    forming recess gate holes in the substrate within the cell region through the first set of gate patterns;
    forming a gate oxide layer in the recessed gate holes and in the gate forming hole;
    forming a gate layer on the gate oxide layer in both the cell region and the periphery region; and
    removing the disposable layer to form recessed cell gate structures in the cell region and cell gate structures in the peripheral region.

13. The method of claim 12, further comprising:
    simultaneously forming spacer structures on the cell gate structures in the cell region and the cell gate structures in the peripheral region.

14. A method for forming a memory device on a substrate having a memory cell region and a peripheral region, the method comprising:
    growing isolation structures to define a plurality of memory cells in the memory cell region, and to define a plurality of transistors in the peripheral region;
    forming a pad oxide layer on the substrate in both the memory cell region and the peripheral region;

forming an etch stopping layer on the pad oxide layer;

forming a protective oxide layer on the pad oxide layer;

depositing a photoresist layer over the protective oxide layer;

forming a recess mask in the photoresist layer in the memory cell region;

etching the substrate in the memory cell region through the recess mask to form a plurality of recessed gate holes;

removing the protective oxide layer, the pad oxide layer, and the etch stopping layer;

forming a gate oxide layer in both the memory cell region and the peripheral region, the gate oxide layer penetrating the plurality of recessed gate holes in the cell region;

forming a gate layer on the gate oxide layer, including within the plurality of recessed gate holes; and simultaneously forming recessed gates for the plurality of memory cells and planar gates for the plurality of transistors in the peripheral region.

15. The method of claim 14, further comprising implanting a substrate isolation in the memory cell region.

16. The method of claim 14, further comprising performing a threshold implantation in the plurality of memory cells.

17. The method of claim 14, further comprising performing a source/drain implantation in the plurality of memory cells.

18. The method of claim 14, further comprising simultaneously forming spacers on the plurality of memory cells and the plurality of transistors in the peripheral region.

19. The method of claim 18, further comprising, after forming spacers on the plurality of memory cells, forming a cobalt-silicon layer on the transistors in the peripheral region.

20. The method of claim 18, wherein forming a cobalt-silicon layer comprises:

maintaining a covering layer on the cell region;

selectively growing an epitaxial structure on plurality of transistors in the peripheral region; and forming the cobalt-silicon layer on the epitaxial structure.

* * * * *